United States Patent
Yao (10) Patent No.: US 9,406,708 B2
(45) Date of Patent: Aug. 2, 2016

(54) IMAGE SENSOR DEVICES AND METHODS FOR FABRICATING THE SAME

(71) Applicant: Silicon Optronics, Inc., Hsinchu (TW)

(72) Inventor: Yu-Yuan Yao, Hsinchu (TW)

(73) Assignee: SILICON OPTRONICS, INC., Hsinchu (TW)

( * ) Notice: Subject to any disclaimer, the term of this patent is extended or adjusted under 35 U.S.C. 154(b) by 6 days.

(21) Appl. No.: 14/196,759

(22) Filed: Mar. 4, 2014

(65) Prior Publication Data

US 2015/0200228 A1  Jul. 16, 2015

(30) Foreign Application Priority Data

Jan. 15, 2014 (TW) .............................. 103101379 A (51) Int. Cl.
*H01L 27/146* (2006.01)

(52) U.S. Cl.
CPC ...... *H01L 27/14614* (2013.01); *H01L 27/1463* (2013.01); *H01L 27/14616* (2013.01); *H01L 27/14689* (2013.01)

(58) Field of Classification Search
CPC ............ H01L 27/14634; H01L 27/146; H01L 27/3239
See application file for complete search history.

(56) References Cited

U.S. PATENT DOCUMENTS

| 2004/0032001 A1* | 2/2004 | Gilmer ............ H01L 21/823462 257/500 |
| 2007/0075337 A1* | 4/2007 | Jung et al. ..................... 257/215 |
| 2013/0140632 A1* | 6/2013 | Landgraf et al. .............. 257/335 |

* cited by examiner

*Primary Examiner* — Mohammad Choudhry
(74) *Attorney, Agent, or Firm* — Muncy, Geissler, Olds & Lowe, P.C.

(57) ABSTRACT

The present invention provides an image sensor device including a substrate, a channel formed in the substrate, a photoelectric transfer region formed in the substrate located at one side of the channel, a voltage transfer region formed in the substrate located at the other side of the channel, a first gate dielectric layer formed on the substrate, a second gate dielectric layer formed on the substrate, wherein the first gate dielectric layer and the second gate dielectric layer have a joint above the channel, and the thickness of the first gate dielectric layer is thicker than that of the second gate dielectric layer, and a gate formed on the first gate dielectric layer and the second gate a is dielectric layer. The present invention also provides a method for fabricating the image sensor device.

10 Claims, 10 Drawing Sheets

IMAGE SENSOR DEVICES AND METHODS FOR FABRICATING THE SAME

CROSS REFERENCE TO RELATED APPLICATIONS

This Application claims priority of Taiwan Patent Application No. 103101379, filed on Jan. 15, 2014, the entirety of which is incorporated by reference herein.

TECHNICAL FIELD

The technical field relates to an image sensor device and a method for fabricating the same.

BACKGROUND

In terms of semiconductor technology, the image sensor device is used to sense the light projecting onto the semiconductor substrate. Common image sensor devices include complementary metal oxide semiconductor (CMOS) image sensor devices and charge coupled device (CCD) sensor devices, widely applied in all respects, for instance, in digital cameras. Those image sensor devices adopt a pixel array to receive light energy in order to transform an image into digital data. The above-mentioned pixel array may include photodiodes (PDs) and transistors. Currently, the structure of the CMOS image sensor device includes 3-T architecture and 4-T architecture. The 3-T architecture may include a reset transistor (RST), source follower (SF) transistor, and row select (RS) transistor etc., while the 4-T architecture may include a transfer transistor (TX), reset transistor (RST), source follower (SF) transistor, and row select (RS) transistor etc.

The transfer transistor (TX) belonging to the above-mentioned 4-T architecture serves to isolate the photodiode (PD) and the floating diffusion (FD) under an exposure operation or transfer charges from the photodiode (PD) to the floating diffusion (FD) under a readout operation.

Conventionally, the threshold voltage of the transfer transistor can be altered by process adjustment, for example, channel implantation doping, various thicknesses of gate dielectric layer or polysilicon implantation doping, etc. Generally, in the transfer transistor, the threshold voltage along the channel between the photodiode (PD) and the floating diffusion (FD) is uniform. While applying a higher operating voltage than the threshold voltage, the transfer transistor is turned on, and charges are transferred from the photodiode (PD) to the floating diffusion (FD). During this procedure, how to improve charge transfer efficiency is really important. On the other hand, while turning the transfer transistor off, how to prevent charges from leakage from the photodiode (PD) to the channel and to prevent residual charges in the channel from backflow to the photodiode (PD) is then important.

However, based on the conventional structural design of the transfer transistor, the potential energy distribution of the channel cannot be conducive to turn-on and turn-off statuses simultaneously.

SUMMARY

In an embodiment of the invention, an image sensor device is provided. The image sensor device comprises a substrate; a channel formed in the substrate; a photoelectric transfer region formed in the substrate located at one side of the channel; a voltage transfer region formed in the substrate located at the other side of the channel; a first gate dielectric layer formed on the substrate; a second gate dielectric layer formed on the substrate, wherein the first gate dielectric layer and the second gate dielectric layer have a joint above the channel, and the thickness of the first gate dielectric layer is thicker than the thickness of the second gate dielectric layer; and a gate formed on the first gate dielectric layer and the second gate dielectric layer.

In another embodiment of the invention, a method for fabricating an image sensor device is provided. The method comprises providing a substrate; forming a channel in the substrate; forming a first gate dielectric layer and a second gate dielectric layer on the substrate, wherein the first gate dielectric layer and the second gate dielectric layer form a joint above the channel, and the thickness of the first gate dielectric layer is thicker than the thickness of the second gate dielectric layer; forming a gate on the first gate dielectric layer and the second gate dielectric layer; forming a photoelectric transfer region in the substrate located at one side of the channel; and forming a voltage transfer region in the substrate located at the other side of the channel.

In the present invention, the potential energy distribution of the channel presents one high status and one low status during turning on or turning off due to the structural design of the two gate dielectric layers with various thicknesses therebetween and formation of a joint between the two gate dielectric layers above the channel. When the gate is turned on, the charges are not prone to staying in the channel and being thoroughly transferred to the voltage transfer region due to the lower potential energy of the channel adjacent to the potential energy of the voltage transfer region, dramatically improving charge transfer efficiency. When the gate is turned off, the charges are not easily leaked from the photoelectric transfer region, for example photodiode (PD), to the channel, and backflow of residual charges in the channel to the photodiode (PD) can be avoided due to the higher potential energy of the channel being significantly higher than the potential energy of the photoelectric transfer region.

A detailed description is given in the following embodiments with reference to the accompanying drawings.

BRIEF DESCRIPTION OF THE DRAWINGS

The invention can be more fully understood by reading the subsequent detailed descriptions and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
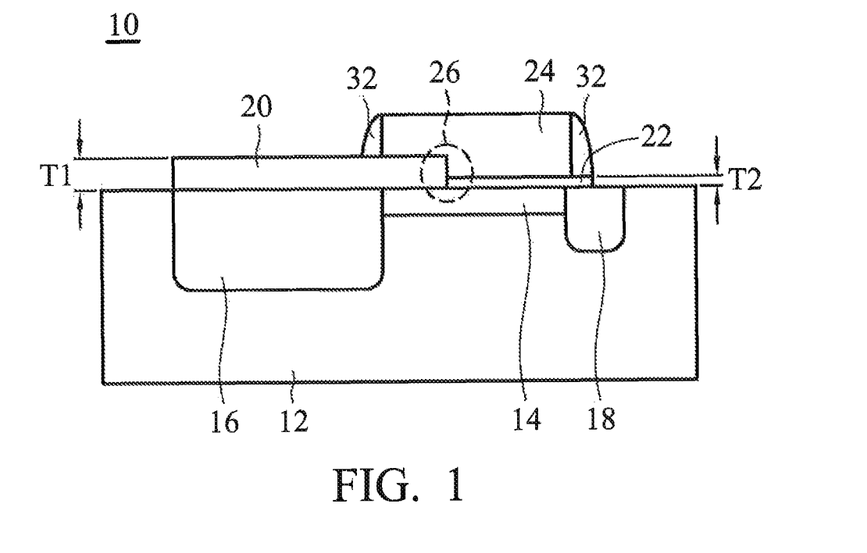
FIG. 1 shows a cross-sectional view of an image sensor device in accordance with an embodiment of the invention.

Referring to FIG. 1, according to one embodiment of the invention, an image sensor device is disclosed. The image sensor device 10 comprises a substrate 12, a channel 14 formed in the substrate 12, a photoelectric transfer region 16 formed in the substrate 12 located at one side of the channel 14, a voltage transfer region 18 formed in the substrate 12 located at the other side of the channel 14, a first gate dielectric layer 20 formed on the substrate 12, a second gate dielectric layer 22 formed on the substrate 12, and a gate 24 formed on the first gate dielectric layer 20 and the second gate dielectric layer 22. Specifically, the first gate dielectric layer 20 and the second gate dielectric layer 22 have a joint 26 above the channel 14, and the thickness T1 of the first gate dielectric layer 20 is thicker than the thickness T2 of the second gate dielectric layer 22. In one embodiment, the thickness T1 of the first gate dielectric layer 20 and the thickness T2 of the second gate dielectric layer 22 have a ratio of about 2:1-6:1.

In one embodiment, the substrate 12 may be a semiconductor substrate such as a silicon substrate doped with p-type dopants. However, the invention is not limited thereto. In other embodiments, the substrate 12 may also comprise other semiconductor materials, for example, elementary semiconductor such as germanium or diamond, etc., or compound semiconductor such as silicon carbide, gallium arsenide, indium arsenide or indium phosphide, etc. In other embodiments, the substrate 12 may also comprise an epitaxial layer on bulk semiconductor, a silicon germanium layer on bulk silicon, a silicon material layer on hulk silicon germanium or silicon-on-insulator (SOI), etc. Additionally, in other embodiments, the substrate 12 may also comprise an epitaxial layer doped with p-type or n-type dopants.

In one embodiment, the photoelectric transfer region 16 may comprise a photoelectric transfer element, for example, a photodiode (PD). In other embodiments, other photoelectric transfer elements may also be applicable.

In one embodiment, the voltage transfer region 18 may be a floating diffusion (FD), which may be regarded as a voltage transfer element, for example, a capacitor structure.

In one embodiment, the materials of the first gate dielectric layer 20 and the second gate dielectric layer 22 may be the same or different, for example, silicon oxide, silicon nitride, silicon oxynitride or combinations thereof.

In one embodiment, the gate 24 may comprise polycrystalline silicon or monocrystalline silicon, which may be used as a transfer gate.

Referring to FIGS. 2A-2I, according to one embodiment of the invention, a method for fabricating an image sensor device is disclosed. First, referring to FIG. 2A, a substrate 12 is provided. In one embodiment, the substrate 12 may be a semiconductor substrate such as a silicon substrate doped with p-type dopants. However, the invention is not limited thereto. In other embodiments, the substrate 12 may also comprise other semiconductor materials, for example, elementary semiconductor such as germanium or diamond, etc., or compound semiconductor such as silicon carbide, gallium arsenide, indium arsenide or indium phosphide, etc. In other embodiments, the substrate 12 may also comprise an epitaxial layer on bulk semiconductor, a silicon germanium layer on bulk silicon, a silicon material layer on bulk silicon germanium or silicon-on-insulator (SOI), etc. Additionally, in other embodiments, the substrate 12 may also comprise an epitaxial layer doped with p-type or n-type dopants.

Figure 2A:
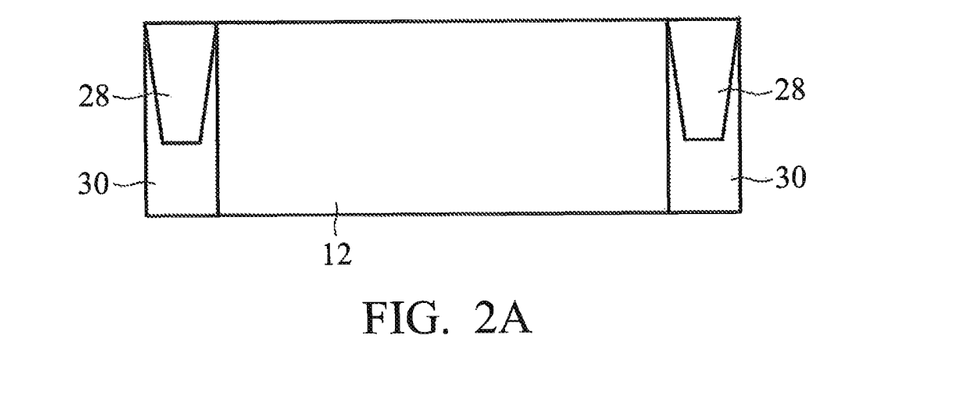
FIGS. 2A-2I disclose a method for fabricating an image sensor device in accordance with an embodiment of the invention.

Next, still referring to FIG. 2A, shallow trench isolations (STIs) 28 and p-type wells (PWs) 30 are fabricated in the substrate 12 by a series of known related processes for fabricating shallow trench isolation (STI) structures and p-type wells (PW).

Figure 2B:
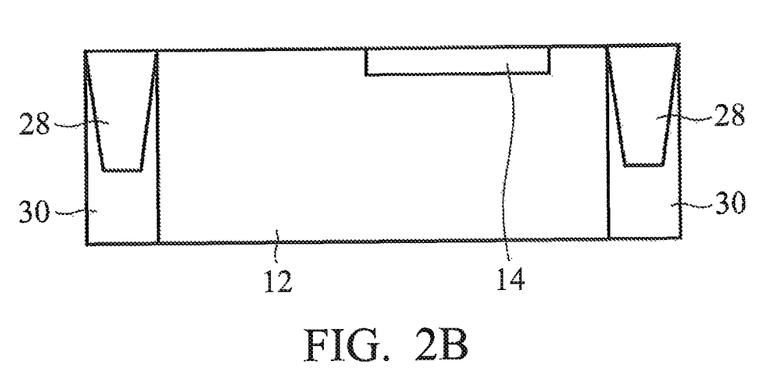

Next, referring to FIG. 2B, for example, an ion implantation process is performed on the substrate 12 to define a channel 14 in the substrate 12.

Figure 2C:
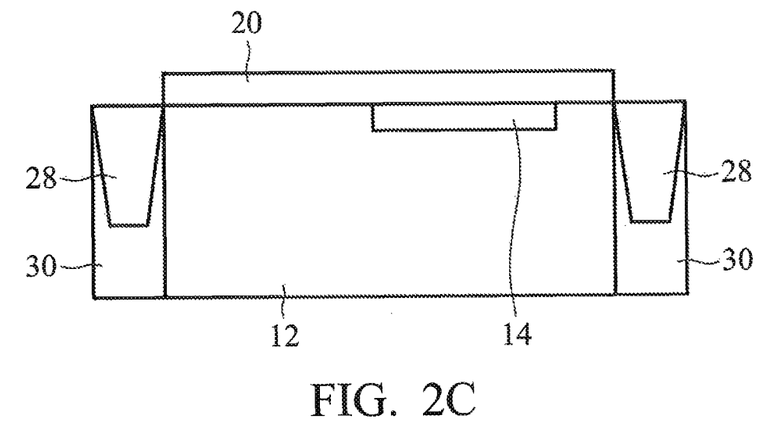

Next, referring to FIG. 2C, a gate dielectric layer 20 is formed on the substrate 12 by related deposition or oxidation processes such as chemical vapor deposition (CVD) or thermal oxidation, etc.

Figure 2D:
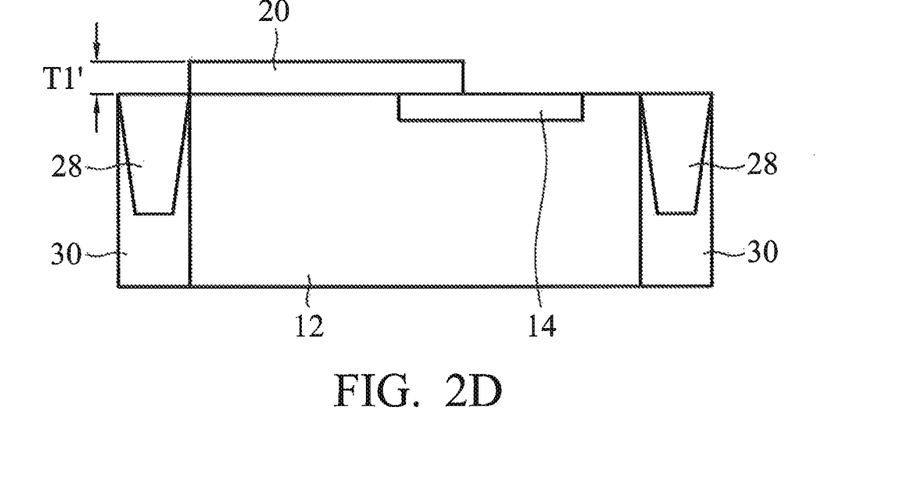

Next, referring to FIG. 2D, the gate dielectric layer 20 is patterned to cover at least part of the channel 14 to form a first gate dielectric layer 20 having a thickness T1'.

Figure 2E:
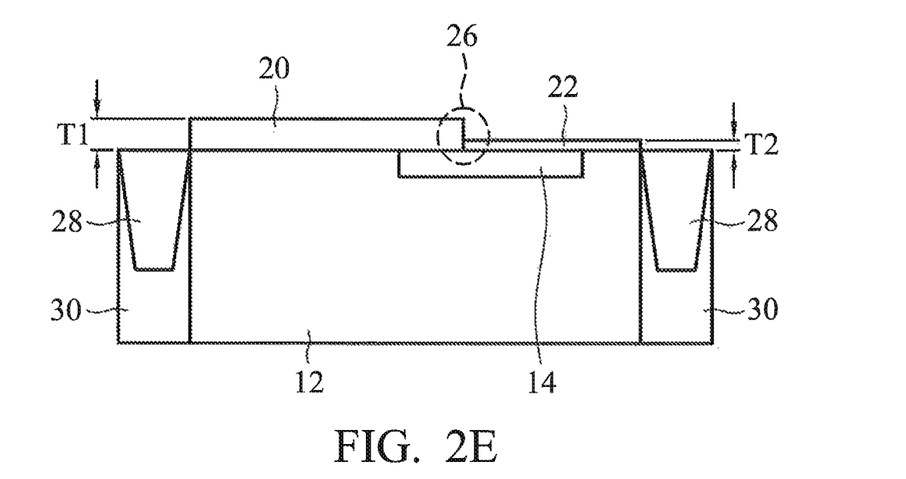

Next, referring to FIG. 2E, another gate dielectric layer 22 is conformally formed on the first gate dielectric layer 20 and the substrate 12 by related deposition or oxidation processes such as chemical vapor deposition (CVD) or thermal oxidation, etc. to form a second gate dielectric layer 22 having a thickness T2. Now, the first gate dielectric layer 20 has a thickness T1 (T1>T1').

Specifically, the first gate dielectric layer 20 and the second gate dielectric layer 22 form a joint 26 which may he located at any place above the channel 14. The thickness T1 of the first gate dielectric layer 20 is thicker than the thickness T2 of the second gate dielectric layer 22. In one embodiment, the thickness T1 of the first gate dielectric layer 20 and the thickness T2 of the second gate dielectric layer 22 have a ratio of about 2:1-6:1. In one embodiment, the materials of the first gate dielectric layer 20 and the second gate dielectric layer 22 may be the same or different, for example, silicon oxide, silicon nitride, silicon oxynitride or combinations thereof.

Figure 2F:
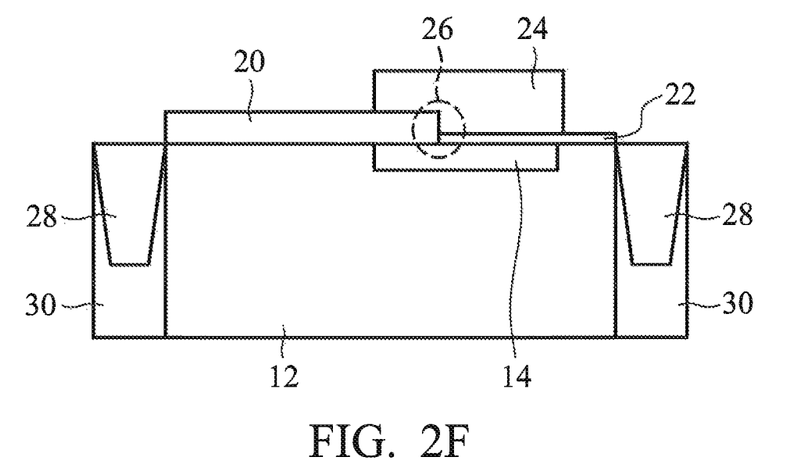

Next, referring to FIG. 2F, a gate 24 is formed on the first gate dielectric layer 20 and the second gate dielectric layer 22 by, for example, low pressure chemical vapor deposition (LPCVD), physical vapor deposition (PVD) with proper silicon source materials or any appropriate related deposition processes. In one embodiment, the gate 24 may comprise polycrystalline silicon or monocrystalline silicon. Specifically, the gate 24 serves as a transfer gate.

Figure 2G:
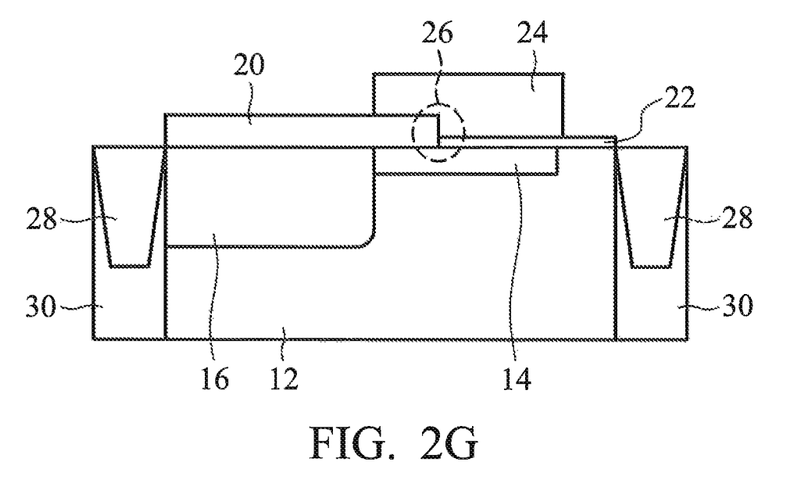

Next, referring to FIG. 2G, for example, single or multiple implantation processes are performed on the substrate 12 to form a photoelectric transfer region 16 in the substrate 12 located at one side of the channel 14. In one embodiment, when the substrate 12 is an epitaxial layer doped with p-type dopants, n-type dopants are implanted into the region for subsequently forming the photoelectric transfer region 16 in the substrate 12 to form a PN photoelectric transfer region, for example, forming a photoelectric transfer element of a PN photodiode. In another embodiment, p-type dopants may further be implanted into the surface of the above-mentioned region doped with n-type dopants to form a PNP photoelectric transfer region, for example, forming a photoelectric transfer element of a PNP phototriode.

Figure 2H:
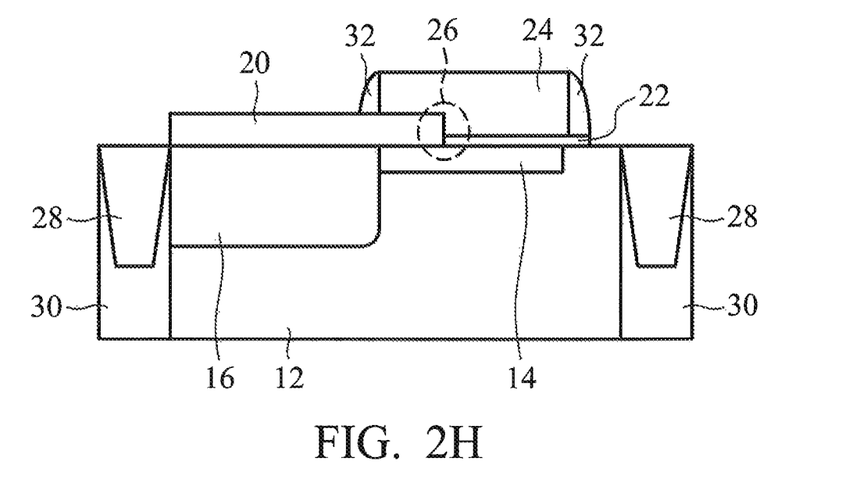

Next, referring to FIG. 2H, spacers 32 are formed on the sidewalls of the gate 24 by known related processes for fabricating spacers.

Figure 2I:
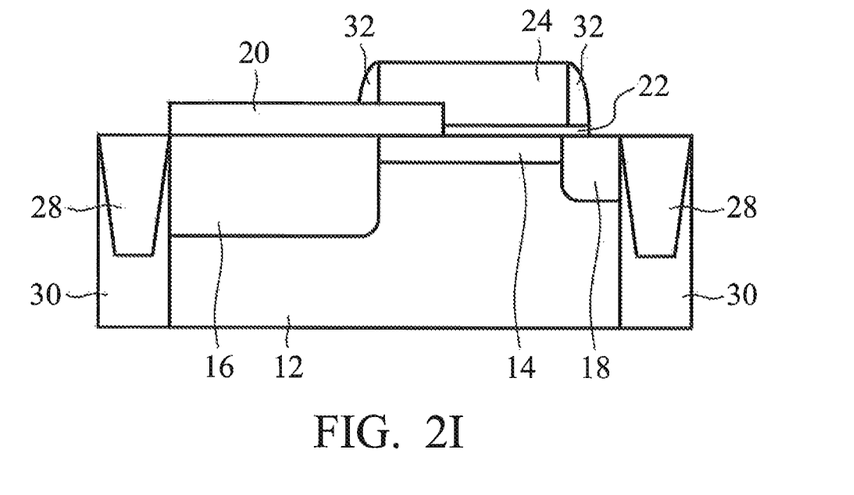

Next, referring to FIG. 2I, for example, an implantation process is performed on the substrate 12 to form a voltage transfer region 18 in the substrate 12 located at the other side of the channel 14. In one embodiment, when the substrate 12 is an epitaxial layer doped with p-type dopants, n-type dopants are implanted into the region for subsequently forming the voltage transfer region 18 in the substrate 12 to form a $N^+$ voltage transfer region 18. In one embodiment, the voltage transfer region 18 is defined as a floating diffusion (FD) which may be regarded as a voltage transfer element, for example, a capacitor structure. Therefore, the image sensor device of the invention is fabricated.

Referring to FIGS. 3A-3H, according to one embodiment of the invention, a method for fabricating an image sensor device is disclosed. First, referring to FIG. 3A, a substrate 12 is provided. In one embodiment, the substrate 12 may be a semiconductor substrate such as a silicon substrate doped with p-type dopants. However, the invention is not limited thereto. In other embodiments, the substrate 12 may also comprise other semiconductor materials, for example, elementary semiconductor such as germanium or diamond, etc., or compound semiconductor such as silicon carbide, gallium arsenide, indium arsenide or indium phosphide, etc. In other embodiments, the substrate 12 may also comprise an epitaxial layer on bulk semiconductor, a silicon germanium layer on bulk silicon, a silicon material layer on bulk silicon germanium or silicon-on-insulator (SOI), etc. Additionally, in other embodiments, the substrate 12 may also comprise an epitaxial layer doped with p-type or n-type dopants.

Figure 3A:
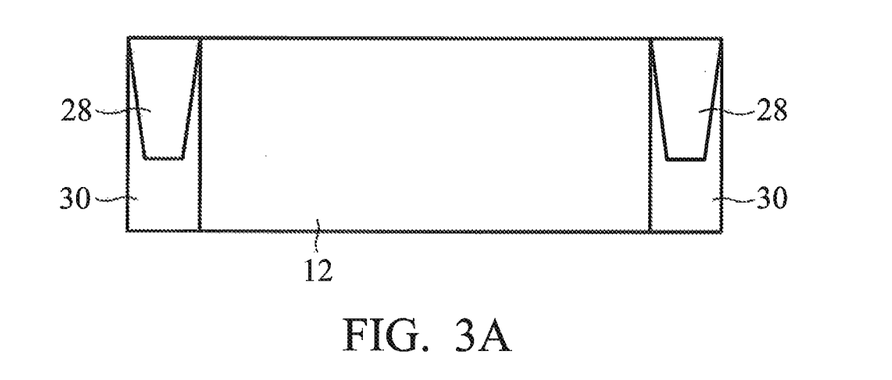
FIGS. 3A-3H disclose a method for fabricating an image sensor device in accordance with an embodiment of the invention.

Next, still referring to FIG. 3A, shallow trench isolations (STIs) 28 and p-type wells (PWs) 30 are fabricated in the substrate 12 by a series of known related processes for fabricating shallow trench isolation (STI) structures and p-type wells (PW).

Figure 3B:
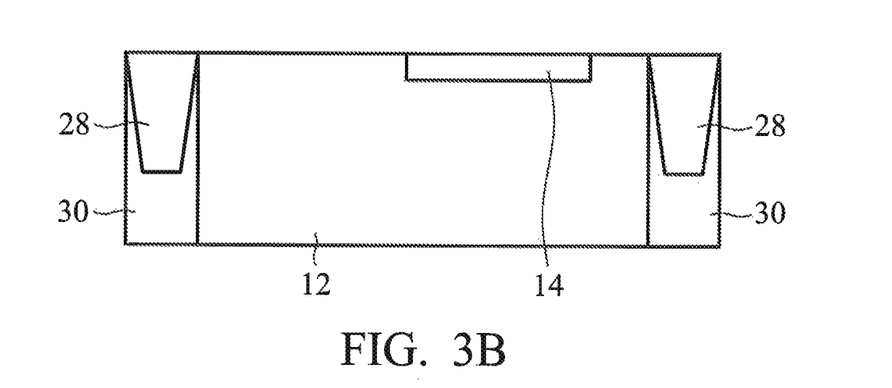

Next, referring to FIG. 3B, for example, an ion implantation process is performed on the substrate 12 to define a channel 14 in the substrate 12.

Figure 3C:
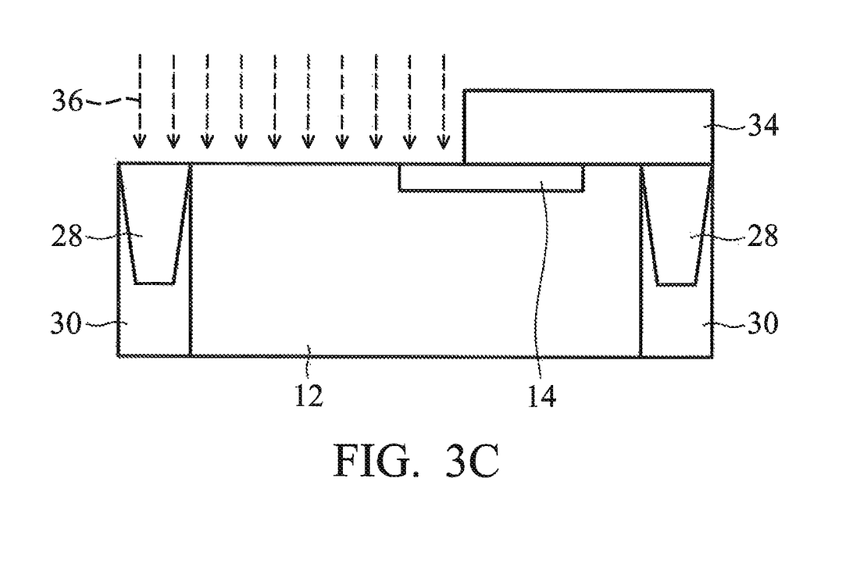

Next, referring to FIG. 3C, a photoresist layer 34 is covered on the substrate 12 to expose the region for subsequently forming the first gate dielectric layer. Next, an ion implantation process, for example, oxygen implantation 36, is performed on the above-mentioned region for subsequently forming the first gate dielectric layer.

Figure 3D:
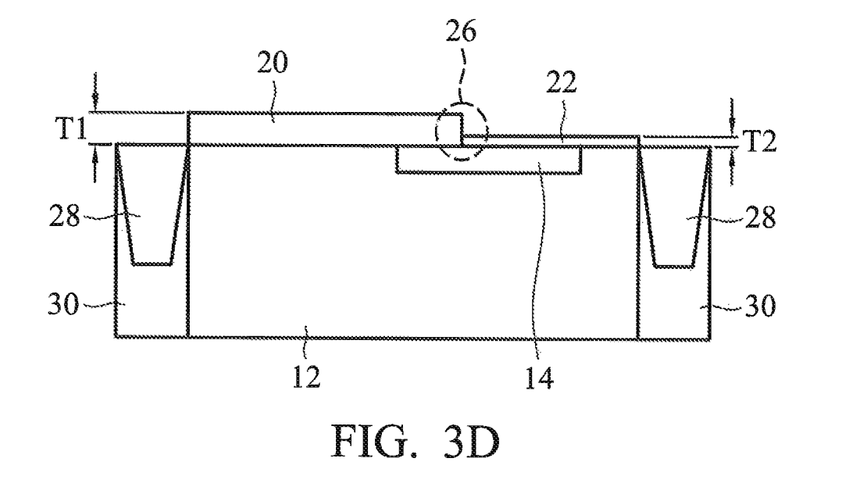

Next, referring to FIG. 3D, for example, a thermal oxidation process is performed on the substrate 12 to grow a first gate dielectric layer 20 and a second gate dielectric layer 22. The first gate dielectric layer 20 has a thickness T1. The second gate dielectric layer 22 has a thickness T2. The growth rate of the first gate dielectric layer 20 is faster than the growth rate of the second gate dielectric layer 22 during the thermal oxidation process due to performance of the ion implantation process such as the oxygen implantation on the region for subsequently forming the first gate dielectric layer 20 of the surface of the substrate 12 before the first gate dielectric layer 20 and the second gate dielectric layer 22 are grown in this embodiment. Therefore, the growth thickness T1 of the first gate dielectric layer 20 is thicker than the growth thickness T2 of the second gate dielectric layer 22. In one embodiment, the thickness T1 of the first gate dielectric layer 20 and the thickness T2 of the second gate dielectric layer 22 have a ratio of about 2:1-6:1. After the thermal oxidation process, the first gate dielectric layer 20 covers at least part of the channel 14 and forms a joint 26 with the second gate dielectric layer 22. Specifically, the joint 26 is located at any place above the channel 14. In one embodiment, the materials of the first gate dielectric layer 20 and the second gate dielectric layer 22 may be the same or different, for example, silicon oxide, silicon nitride, silicon oxynitride or combinations thereof.

Figure 3E:
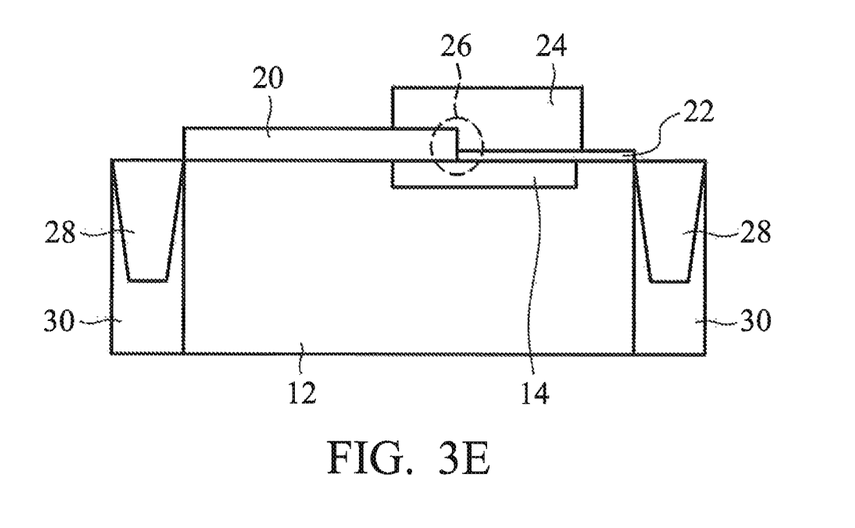

Next, referring to FIG. 3E, a gate 24 is formed on the first gate dielectric layer 20 and the second gate dielectric layer 22 by, for example, low pressure chemical vapor deposition (LPCVD), physical vapor deposition (PVD) with proper silicon source materials or any appropriate related deposition processes. In one embodiment, the gate 24 may comprise polycrystalline silicon or monocrystalline silicon. Specifically, the gate 24 serves as a transfer gate.

Figure 3F:
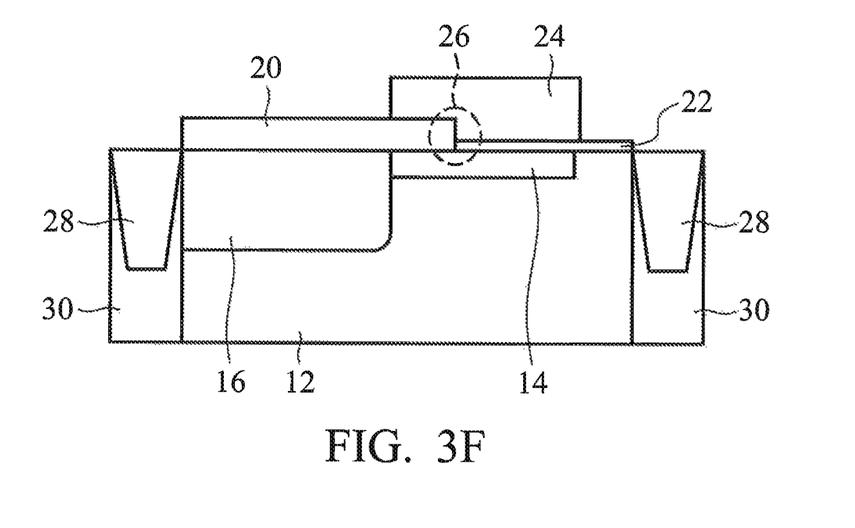

Next, referring to FIG. 3F, for example, single or multiple implantation processes are performed on the substrate 12 to form a photoelectric transfer region 16 in the substrate 12 located at one side of the channel 14. In one embodiment, when the substrate 12 is an epitaxial layer doped with p-type dopants, n-type dopants are implanted into the region for subsequently forming the photoelectric transfer region 16 in the substrate 12 to form a PN photoelectric transfer region, for example, forming a photoelectric transfer element of a PN photodiode. In another embodiment, p-type dopants may further be implanted into the surface of the above-mentioned region doped with n-type dopants to form a PNP photoelectric transfer region, for example, forming a photoelectric transfer element of a PNP phototriode.

Figure 3G:
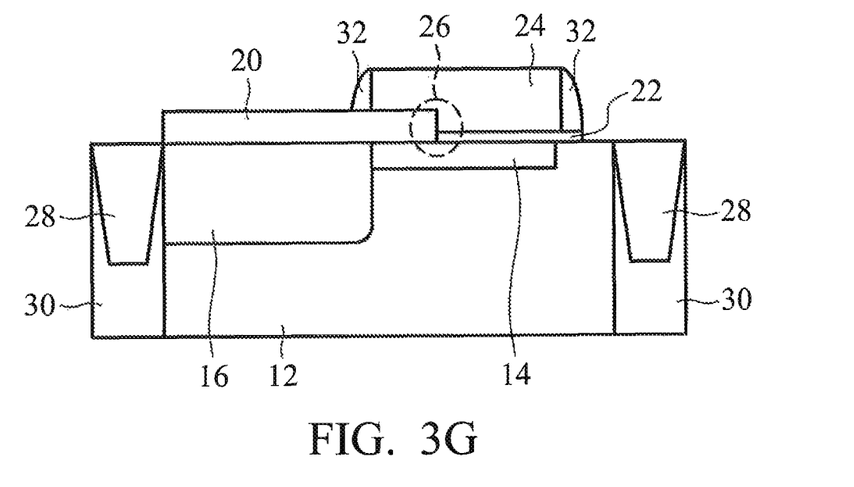

Next, referring to FIG. 3G, spacers 32 are formed on the sidewalls of the gate 24 by known related processes for fabricating spacers.

Figure 3H:
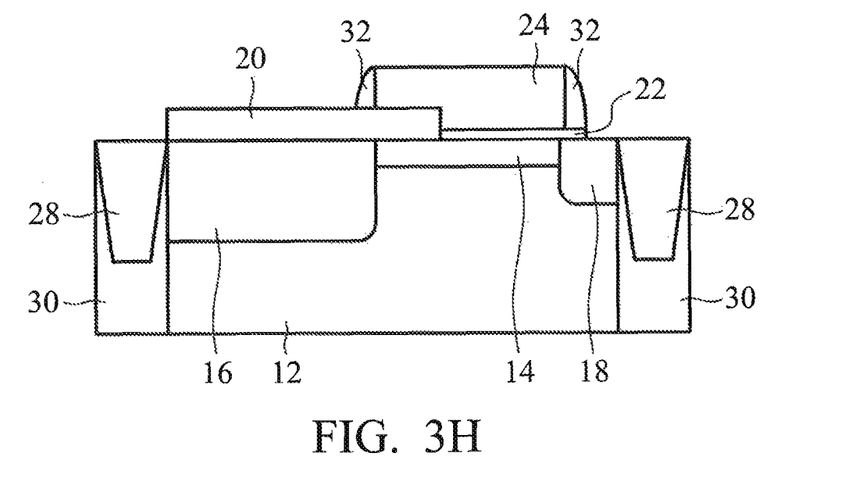

Next, referring to FIG. 3H, for example, an implantation process is performed on the substrate 12 to form a voltage transfer region 18 in the substrate 12 located at the other side of the channel 14. In one embodiment, when the substrate 12 is an epitaxial layer doped with p-type dopants, n-type dopants are implanted into the region for subsequently forming the voltage transfer region 18 in the substrate 12 to form a $N^+$ voltage transfer region 18. In one embodiment, the voltage transfer region 18 is defined as a floating diffusion (FD), which may be regarded as a voltage transfer element, for example, a capacitor structure. Therefore, the image sensor device of the invention is fabricated.

Figure 4A:
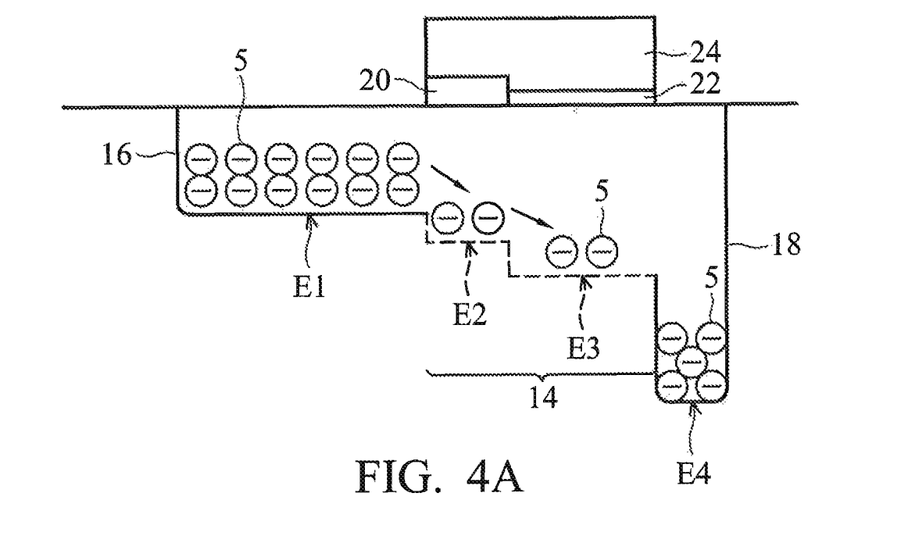
FIG. 4A shows potential energy distribution of a photoelectric transfer region, a channel and a voltage transfer region when an image sensor device is turned on in accordance with an embodiment of the invention.
Figure 4B:
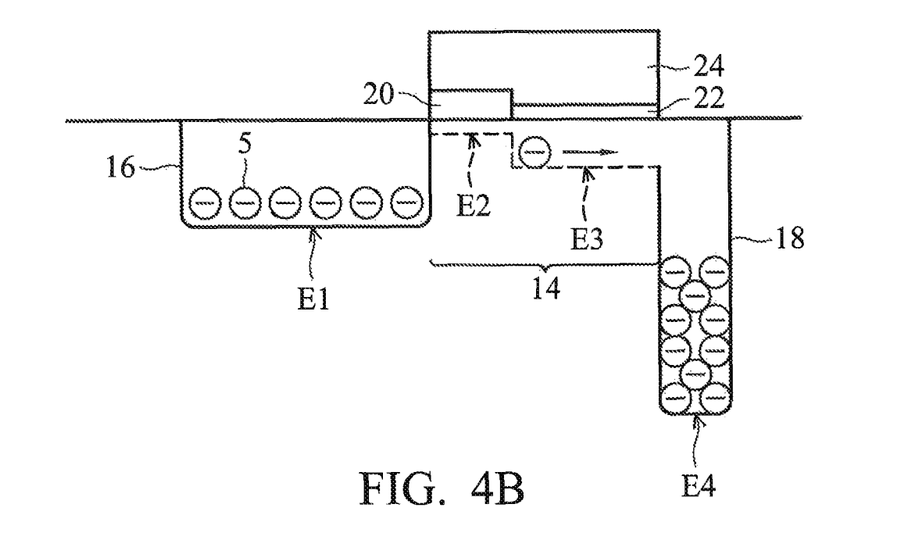
FIG. 4B shows potential energy distribution of a photoelectric transfer region, a channel and a voltage transfer region when an image sensor device is turned off in accordance with an embodiment of the invention.

Referring to FIGS. 4A and 4B, the turn-on status and turn-off status of the image sensor device of the invention are described. FIG. 4A shows potential energy distribution of a photoelectric transfer region, a channel and a voltage transfer region when a gate of an image sensor device of the invention is turned on. FIG. 4B shows potential energy distribution of a photoelectric transfer region, a channel and a voltage transfer region when a gate of an image sensor device of the invention is turned off. First, referring to FIG. 4A, when the gate 24 is turned on (applying an operating voltage to the gate 24), the potential energy distribution of the photoelectric transfer region 16, the channel 14 and the voltage transfer region 18 are shown in FIG. 4A, for example, the potential energy E1 of the photoelectric transfer region 16, the potential energy E2 and E3 of the channel 14 and the potential energy E4 of the voltage transfer region 18. Specifically, two kinds of potential energy status of the channel 14 are presented, that is, one high status (the channel potential energy E2 corresponding to the first gate dielectric layer 20) and one low status (the channel potential energy E3 corresponding to the second gate dielectric layer 22) due to various thicknesses between the first gate dielectric layer 20 and the second gate dielectric layer 22 (i.e. the thickness of the first gate dielectric layer 20 is thicker than the thickness of the second gate dielectric layer 22). At this time, the charges 5 accumulated in the photoelectric transfer region 16 by illumination are transferred from the high-potential-energy photoelectric transfer region 16 to the voltage transfer region 18 via the channel 14 to proceed to a read-out process. When turning on, almost all of the charges 5 in the channel 14 are transferred to the voltage transfer region 18 without accumulation in the channel 14 due to the potential energy E3 of the channel 14 adjacent to the potential energy E4 of the voltage transfer region 18, dramatically improving charge transfer efficiency.

Next, referring to FIG. 4B, when the gate 24 is turned off, the potential energy distribution of the photoelectric transfer region 16, the channel 14 and the voltage transfer region 18 are shown in FIG. 4B, including the potential energy E1 of the photoelectric transfer region 16, the potential energy E2 and E3 of the channel 14 and the potential energy E4 of the voltage transfer region 18. Specifically, two kinds of the potential energy statuses of the channel 14 are presented, that is, one high status (the channel potential energy E2 corresponding to the first gate dielectric layer 20) and one low status (the channel potential energy E3 corresponding to the second gate dielectric layer 22) due to various thicknesses between the first gate dielectric layer 20 and the second gate dielectric layer 22 (i.e. the thickness of the first gate dielectric layer 20 is thicker than the thickness of the second gate dielectric layer 22). At this time, the charges 5 are not easily leaked from the photoelectric transfer region 16 to the channel 14 and backflow of residual charges in the channel 14 to the photoelectric transfer region 16 is not prone to occur due to the potential energy E2 of the channel 14 being significantly higher than the potential energy E1 of the photoelectric transfer region 16, achieving excellent turn-off results.

In the present invention, the potential energy distribution of the channel presents one high status and one low status during turning on or turning off due to the structural design of the two gate dielectric layers with various thicknesses therebetween and formation of a joint between the two gate dielectric layers above the channel. When the gate is turned on, the charges are not prone to staying in the channel and being thoroughly transferred to the voltage transfer region due to the lower potential energy of the channel adjacent to the potential energy of the voltage transfer region, dramatically improving charge transfer efficiency. When the gate is turned off, the charges are not easily leaked from the photoelectric transfer region, for example photodiode (PD), to the channel, and backflow of residual charges in the channel to the photodiode (PD) can be avoided due to the higher potential energy of the channel being significantly higher than the potential energy of the photoelectric transfer region.

It will be apparent to those skilled in the art that various modifications and variations can be made to the disclosed embodiments. It is intended that the specification and examples be considered as exemplary only, with the true scope of the invention being indicated by the following claims and their equivalents.

What is claimed is:

1. An image sensor device, comprising:
    a substrate;
    a channel formed in the substrate;
    a photoelectric transfer region formed in the substrate located at one side of the channel;
    a voltage transfer region formed in the substrate located at the other side of the channel;
    a first gate dielectric layer formed on the substrate above the photoelectric transfer region;
    a second gate dielectric layer formed on the substrate above the voltage transfer region, wherein the first gate dielectric layer and the second gate dielectric layer have a joint above the channel, and the thickness of the first gate dielectric layer is thicker than the thickness of the second gate dielectric layer, wherein the first gate dielectric layer has a uniform thickness to the joint; and
    a gate formed on the first gate dielectric layer and the second gate dielectric layer.

2. The image sensor device as claimed in claim 1, wherein the photoelectric transfer region comprises a photodiode (PD).

3. The image sensor device as claimed in claim 1, wherein the voltage transfer region is a floating diffusion (FD).

4. The image sensor device as claimed in claim 1, wherein the voltage transfer region comprises a capacitor.

5. The image sensor device as claimed in claim 1, wherein the first gate dielectric layer and the second gate dielectric layer have a thickness ratio of about 2:1-6:1.

6. The image sensor device as claimed in claim 1, wherein the gate is a transfer gate.

7. A method for fabricating an image sensor device, comprising:
    providing a substrate;
    forming a channel in the substrate;
    forming a first gate dielectric layer and a second gate dielectric layer on the substrate, wherein the first gate dielectric layer and the second gate dielectric layer form a joint above the channel, and the thickness of the first gate dielectric layer is thicker than the thickness of the second gate dielectric layer, wherein the first gate dielectric layer has a uniform thickness to the joint;
    forming a gate on the first gate dielectric layer and the second gate dielectric layer;
    forming a photoelectric transfer region in the substrate located at one side of the channel below the first gate dielectric layer; and
    forming a voltage transfer region in the substrate located at the other side of the channel below the second gate dielectric layer.

8. The method for fabricating an image sensor device as claimed in claim 7, wherein the first gate dielectric layer and the second gate dielectric layer have a thickness ratio of about 2:1-6:1.

9. The method for fabricating an image sensor device as claimed in claim 7, further comprising performing an ion implantation process on the surface of the substrate before the first gate dielectric layer and the second gate dielectric layer are formed.

10. The method for fabricating an image sensor device as claimed in claim 9, wherein the ion implantation process is performed on a region for subsequently forming the first gate dielectric layer on the surface of the substrate.

* * * * *